United States Patent
Choi (10) Patent No.: US 11,143,957 B2
(45) Date of Patent: Oct. 12, 2021

(54) APPARATUS FOR SEPARATING A MASTER TEMPLATE FROM A REPLICA TEMPLATE

(71) Applicant: Canon Kabushiki Kaisha, Tokyo (JP)

(72) Inventor: Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 16/830,427

(22) Filed: Mar. 26, 2020

(65) Prior Publication Data

US 2020/0225575 A1 Jul. 16, 2020

Related U.S. Application Data

(62) Division of application No. 15/338,735, filed on Oct. 31, 2016, now Pat. No. 10,627,715.

(51) Int. Cl.
*G03F 7/00* (2006.01)

(52) U.S. Cl.
CPC .................. *G03F 7/0002* (2013.01)

(58) Field of Classification Search
CPC ............... G03F 7/0002; H01L 21/0274; H01L 21/67132; H01L 21/67092
See application file for complete search history.

(56) References Cited

U.S. PATENT DOCUMENTS

| | | | |
|---|---|---|---|
| 6,873,087 B1 | 3/2005 | Choi et al. | |
| 6,932,934 B2 | 8/2005 | Choi et al. | |
| 7,077,992 B2 | 7/2006 | Sreenivasan et al. | |
| 7,157,036 B2 | 1/2007 | Choi et al. | |
| 7,179,396 B2 | 2/2007 | Sreenivasan | |
| 7,229,273 B2* | 6/2007 | Bailey | B29C 35/0888 425/385 |
| 7,396,475 B2 | 7/2008 | Sreenivasan | |
| 7,591,641 B2 | 9/2009 | Saito et al. | |
| 7,906,058 B2 | 3/2011 | Ganapathisubramanian et al. | |
| 8,076,386 B2 | 12/2011 | Xu et al. | |
| 8,361,371 B2 | 1/2013 | Khusnatdinov et al. | |
| 8,652,393 B2 | 2/2014 | Khusnatdinov et al. | |
| 8,968,620 B2 | 3/2015 | Im et al. | |
| 9,272,462 B2 | 3/2016 | Okada et al. | |
| 10,288,999 B2 | 1/2019 | Choi | |
| 10,578,964 B2 | 3/2020 | Ganapathisubramanian et al. | |
| 2006/0216413 A1* | 9/2006 | Saito | G03F 7/0002 427/162 |
| 2010/0102469 A1 | 4/2010 | Khusnatdinov et al. | |
| 2010/0244326 A1 | 9/2010 | Tokue et al. | |
| 2011/0109012 A1 | 5/2011 | Furutono et al. | |
| 2011/0189329 A1 | 8/2011 | Miller et al. | |
| 2013/0207309 A1 | 8/2013 | Okada et al. | |

(Continued)

FOREIGN PATENT DOCUMENTS

| | | |
|---|---|---|
| JP | 2010-221374 A | 10/2010 |
| KR | 10-2016-0103020 A | 8/2016 |
| TW | 201144091 A | 12/2011 |

*Primary Examiner* — Jacob T Minskey
*Assistant Examiner* — S. Behrooz Ghorishi
(74) *Attorney, Agent, or Firm* — Daniel Ratoff (57) ABSTRACT

An apparatus is described for separation of a nanoimprint template from a solidified patterned layer on a substrate that minimize separation defects, including last point of separation (LPOS) defects. The apparatus is configured to move the template and substrate relative to one another and determining an amount of pressure to apply to the backsides of the template and the substrate.

13 Claims, 9 Drawing Sheets

(56) References Cited

U.S. PATENT DOCUMENTS

2015/0165671 A1* 6/2015 Im .................... B29C 59/02
                                                                             264/293
2018/0136556 A1 5/2018 Choi et al.
2018/0149968 A1 5/2018 Choi et al.

* cited by examiner

*FIG. 9B* ered to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Unlike other lithographic processes that rely on projection optics, such as e.g. i-line, DUV, ArF, ArF immersion, etc., nanoimprint lithography applies a pattern to a substrate by filling the relief images provided on an imprint template (or mask) with a formable resist material and then converting the material into a solid, for example, by applying UV light to a UV-curable form of resist material. This method has the advantage of enabling superior resolution relative to the other lithographic methods because the final pattern is no longer dependent on the wavelength of the light source and the aerial image projected onto the resist material. After solidification, the template is separated from the solidified patterned resist material. Template separation itself, however, can be a source of pattern defects that are generally referred to as separation defects. These can take the form of, for example, collapsed features or features that are torn away from the substrate. As a result, there continues to be a need for systems and methods that minimize sources of separation defects in nanoimprint lithography processes.

APPARATUS FOR SEPARATING A MASTER TEMPLATE FROM A REPLICA TEMPLATE

CROSS-REFERENCE TO RELATED APPLICATIONS

This application is a divisional of and claims priority under 35 U.S.C. § 120 to U.S. patent application Ser. No. 15/338,735, entitled "METHOD FOR SEPARATING A NANOIMPRINT TEMPLATE FROM A SUBSTRATE," by Byung-Jin Choi, filed Oct. 31, 2016, which is a non-provisional application incorporated herein by reference in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Unlike other lithographic processes that rely on projection optics, such as e.g. i-line, DUV, ArF, ArF immersion, etc., nanoimprint lithography applies a pattern to a substrate by filling the relief images provided on an imprint template (or mask) with a formable resist material and then converting the material into a solid, for example, by applying UV light to a UV-curable form of resist material. This method has the advantage of enabling superior resolution relative to the other lithographic methods because the final pattern is no longer dependent on the wavelength of the light source and the aerial image projected onto the resist material. After solidification, the template is separated from the solidified patterned resist material. Template separation itself, however, can be a source of pattern defects that are generally referred to as separation defects. These can take the form of, for example, collapsed features or features that are torn away from the substrate. As a result, there continues to be a need for systems and methods that minimize sources of separation defects in nanoimprint lithography processes.

SUMMARY

Innovative aspects of the subject matter described in this specification may be embodied in methods of separating a nanoimprint template from a solidified patterned layer that include the actions of: (a) moving the template and substrate relative to one another to create a tensional force that is applied to the template and the substrate; (b) measuring the tensional force applied to the template and the substrate; (c) determining an amount of pressure to apply to the backsides of the template and the substrate to reduce the amount of applied tensional force; (d) reducing the tensional force applied to the template or the substrate by applying the determined amount of pressure to the backsides of the template and the substrate; and (e) repeating steps (a)-(d) one or more times until the template fully separates from the solidified patterned layer. Other embodiments of these aspects include corresponding systems and apparatus configured to perform the actions of the methods, and articles of manufacture produced through the use of such methods.

These and other embodiments may each optionally include one or more of the following features. For instance, the applied tensional force induces a bending of the template or the substrate and such bending further creates stored energy in the template or the substrate. The applied pressure to the template or substrate backsides, in turn, counteracts the stored energy. The applied pressure to the template or substrate backsides, in turn, reduces the tensional force to zero or below. The applied tensional force is low during the entirety of the separation, e.g., the applied tensional force does not exceed 6 N. The applied back pressure is removed after the template has fully separated. The template is a master template and the substrate is a replica template substrate. The master templates and replica substrates have cored-out backside areas, or have the same thickness dimensions, or are formed of the same material.

Innovative aspects of the subject matter described in this specification may also be embodied in an apparatus that includes a template chuck or holder configured to hold a template; a substrate chuck or holder configured to hold a substrate; an actuator system configured to adjust the position of the template and the substrate relative to one another; a force detection system configured detect the amount of tensional force applied to the template and substrate during separation of the template from a solidified patterned layer formed on the substrate; a pressure system configured to apply a back pressure to the template, the substrate, or both; and a controller in communication with the force detection system and the pressure system. The controller configured to determine, based on the amount of detected tensional force applied to the template and the substrate, the amount of pressure to apply to the backsides of the template and the substrate to reduce the amount of applied tensional force, and provide a signal to the pressure system such that the pressure system applies the determined amount of back pressure to the template and the substrate to reduce the tensional force applied to the template. Other embodiments of these aspects include corresponding methods performed by the apparatus.

These and other embodiments may each optionally include one or more of the following features. For instance, the controller is further configured to repeat the determining and providing steps until the template is fully separated from the solidified patterned layer. The controller is further configured to determine the amount of pressure to apply to the backsides of the template and the substrate in order to counteract stored energy in the template and substrate that is created by a bending of the template or the substrate induced by the applied tensional force. The controller is further configured to determine the amount of pressure to apply to the backsides of the template and the substrate to reduce the applied tensional force to zero or below. The template is a master template and the substrate is a replica template substrate. The master templates and replica substrates have cored-out backside areas, or have the same thickness dimensions, or are formed of the same material.

Particular implementations of the subject matter described in this specification can be implemented so as to realize one or more of the following advantages: minimizing, if not preventing, separation defects, including last point of separation (LPOS) defects, in nanoimprint processes, such as template replication processes.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Apparatus, systems and methods that minimize sources of separation defects in nanoimprint lithography processes are further detailed herein. Such apparatus, systems and methods, among other things, can achieve at least a reduction in, if not elimination of, so-called last point of separation (or "LPOS") defects.

Figure 1:
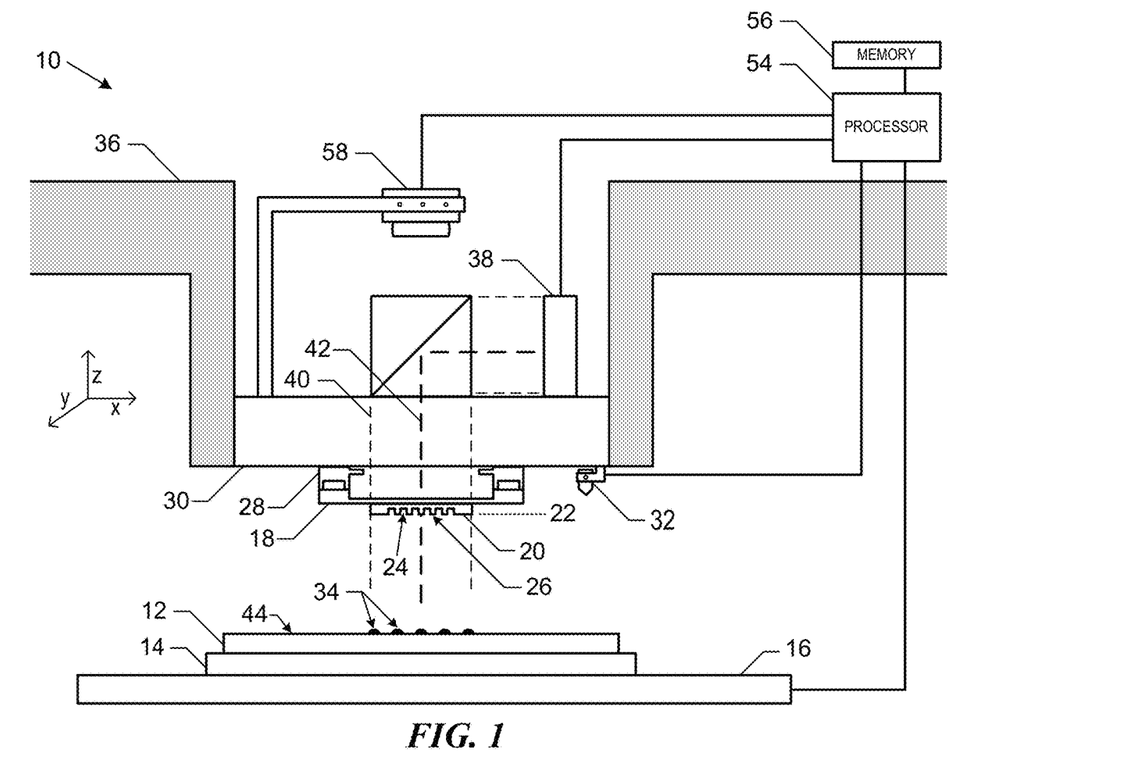
FIG. 1 illustrates a simplified side view of a nanoimprint lithography system having a template and a mold spaced apart from a substrate.

Referring particularly to FIG. 1, illustrated therein is an exemplary nanoimprint lithography system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 may have a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Further, chuck 28 may be coupled to imprint head 30 which in turn may be moveably coupled to bridge 36 such that chuck 28, imprint head 30 and template 18 are moveable in at least the z-axis direction.

Nanoimprint lithography system 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. Nos. 7,157,036 and 8,076,386, both of which are herein incorporated by reference.

Figure 2:
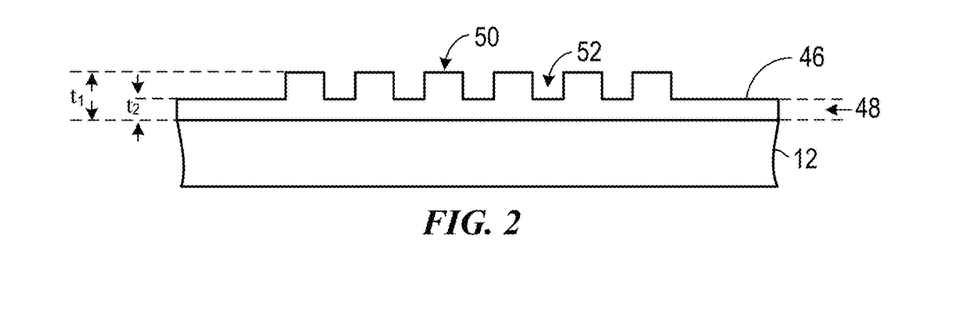
FIG. 2 illustrates a simplified view of the substrate illustrated in FIG. 1, having a solidified patterned layer formed thereon.

Referring to FIGS. 1 and 2, nanoimprint lithography system 10 may further comprise energy source 38 that directs energy 40 along path 42. Imprint head 30 and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head 30, fluid dispense system 32, source 38, and/or camera 58 and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

As has been described, imprint lithography requires direct contact of the mask or template with the formable resist material on the wafer. Because of such contact, it is generally recognized by practitioners that the lifetime of the mask will be limited. As a result, strategies have been adopted to account for the limited template lifetime. First, a master mask is fabricated. This is typically done using an electron beam (e-beam) writing tool to form a pattern in an electron beam resist that has been layered onto a template substrate, such as fused silica. The pattern is subsequently developed and the resulting pattern is then etch transferred into the template substrate to form a master template. After cleaning and inspection steps, and any repairs to remove any unwanted defects, a zero defect or near zero defect master template is created. The master template, however, is not typically used to form patterns on the device wafer. Instead, a replication process is employed to create multiple replica templates, which are then used to form patterns on a device wafer as previously described.

The replication process also typically involves the use of nanoimprint lithography. In this process, the master template is used to transfer a pattern into a formable resist material deposited on the surface of a replica template substrate (or "blank"). The resist material is solidified to form a solid layer that has an inverse pattern to that of master template. The substrate and the solidified layer are then subjected to additional processes, such as etching processes, as previously described to transfer a relief image into the substrate that corresponds to the pattern in the solidified layer, thereby forming a replica template having an inverse pattern of that of the master template. Such replica templates can then be used for production purposes.

It is important in the replication process that defect generation be kept to an absolute minimum, so that the final replica template also has zero or near zero defects. Defects during the replication process can occur from a number of sources. One such defect source arises during the separation of the master template from the replica template substrate, after the formable material is solidified. These defects are generally referred to as separation defects and can take the form of collapsed features or features that are torn away from the surface of the master or replica template. As a result, it is advantageous to develop system and processes that minimize sources of separation defects.

One general approach for reducing separation defects is to match the lateral strain of the template to that of substrate as the separation proceeds. Methods for doing so are described, for example, in U.S. Pat. No. 8,968,620, which is incorporated herein by reference in its entirety. While such methods are effective for lowering separation defects as the template separates from the perimeter of the template inward, such methods are not always wholly adequate to mitigate against separation defects that can occur due to poorly controlled separation conditions that occur during last point of separation (LPOS). This is because separation of the template generally requires generating and maintaining a separation angle between the template and substrate as the separation proceeds. This is typically accomplished by the application of a tensional force to the template or substrate (or both) that is sufficient to create a bending in the template or substrate (or both) in order to establish and maintain such a separation angle. Such bending, however, imparts a spring-like stored or potential energy to the template and substrate. As separation continues, additional tensional force is imparted, increasing template and substrate bending. As a result, stored energy within the substrate and template continues to grow until the point that the surface adhesion and frictional forces that holding the template and substrate together are overcome by the applied tensional force. At this point, the stored energy of the template and substrate is released and converted to kinetic energy that urges the template and substrate back to their unbent state, resulting in an accelerated and uncontrolled separation process that is particularly vulnerable to LPOS separation defects.

Figure 3A:
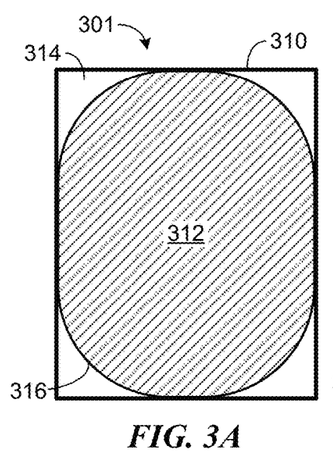
FIGS. 3A-3E illustrate a simplified view of the separation front as a template separates from a substrate and patterned layer formed thereon.
Figure 3B:
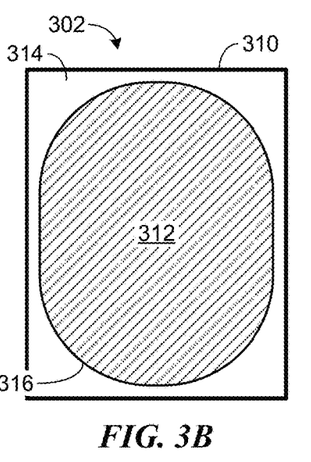
Figure 3C:
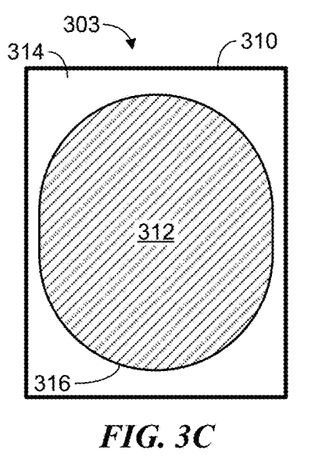
Figure 3D:
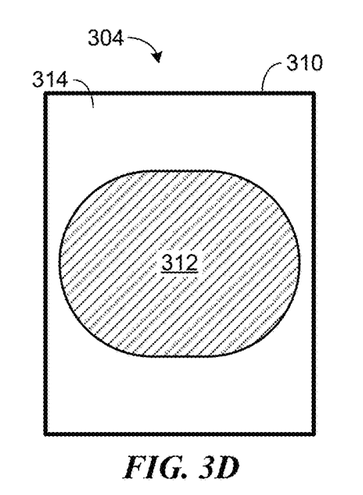
Figure 3E:
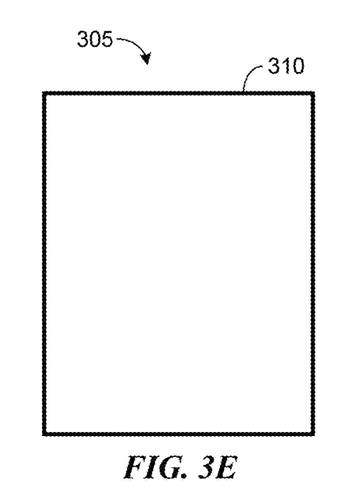

The sequence for such uncontrolled separation under these conditions is further illustrated with reference to FIGS. 3A-3E. More particularly, FIGS. 3A-3E depict simplified illustrations 301-305, respectively, of images taken during the uncontrolled separation of a template from a substrate as just described. Contact area 312 represents the area in which template and substrate are still in contact. Separated area 314 designates that area of the template where separation has already occurred. Contact line 316 indicates the line of demarcation between contact area 312 and separated area 314. As such, contact line 316 can also be considered to mark the separation front as separation proceeds from the perimeter of the template to its center. FIG. 3A shows image 301 taken 13 seconds after initiation of separation. FIGS. 3B, 3C and 3D show subsequent images 302, 303, and 304 taken at approximately 13 second intervals. As can be appreciated, the separation occurring from image 301 through 304 is somewhat controlled, even though the separation front moves non-uniformly; that is the separation lacks radial uniformity. The last image 305 (FIG. 3E), however, was captured only one second after image 304 (FIG. 3D). In preceding image 304, contact area 312 is almost 50% of the initial contact area; by image 305 the contact area is reduced to zero. Thus, in only one second, the resultant buildup of potential energy is rapidly converted to kinetic energy, and a sudden uncontrolled separation of the template occurs (FIG. 3D to FIG. 3E).

Figure 4A:
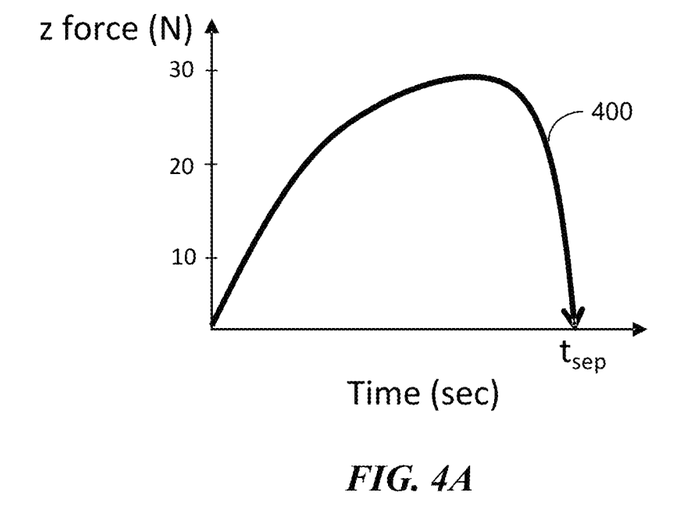
FIG. 4A illustrates a plot of the tensional force applied to the template and substrate as a function of time during the separation depicted in FIGS. 3A-3E.
Figure 4B:
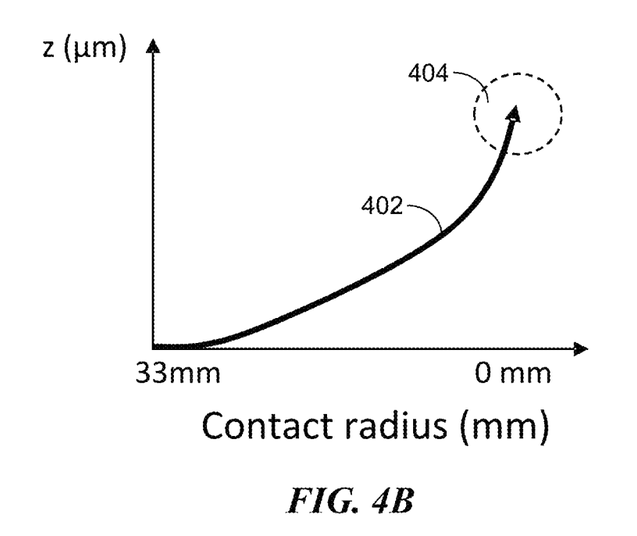
FIG. 4B illustrates a plot of separation acceleration during the separation depicted in FIGS. 3A-3E.

The severity of this sudden, uncontrolled separation process is further illustrated in FIGS. 4A and 4B. Plot 400 in FIG. 4A plots an example of the applied tensional force imparted to overcome the adhesion and friction forces as a function of time for the entire separation process. A typical time scale for separation can range from a second to 10 minutes, with 30 seconds-120 seconds being a more typical process. Note that in plot 400 the tensional force (N) continues to build over time to maximum force of approximately 30 N until the very last moment where the stored energy build up is converted to kinetic energy. Here the force drops rapidly to zero, and a very sudden and uncontrolled final separation occurs between the template and substrate. This sudden separation effect is likewise visualized with reference to plot 402 of FIG. 4B. Plot 402 plots the upward increase in movement (in μm) of imprint head 30 as a function of the contact radius (in mm) between the template and substrate when separation is performed using a system such as system 100. In such systems, the applied tensional force for separation can be applied by the upward movement of imprint head 30. Note that as imprint head 30 initially moved upward, the contact radius recedes gradually and fairly linearly. However, at the end of the sequence (404), a relatively small upward motion of the imprint head triggers the previously described phenomena, with the resultant conversion of stored potential energy into kinetic energy causing the rapid and uncontrolled final separation as the contact radius to rapidly accelerate to zero at the last point of separation (LPOS).

Figure 5A:
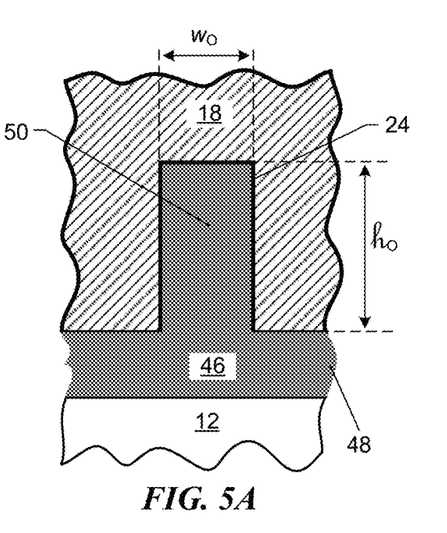
FIGS. 5A-5D illustrate a simplified view of separation defects.
Figure 5B:
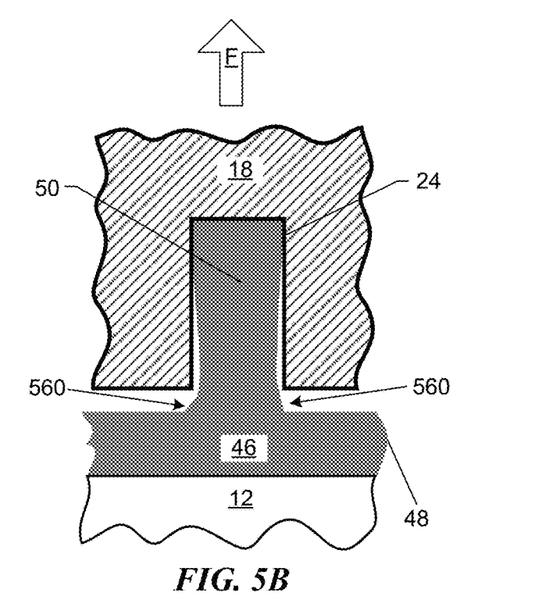
Figure 5C:
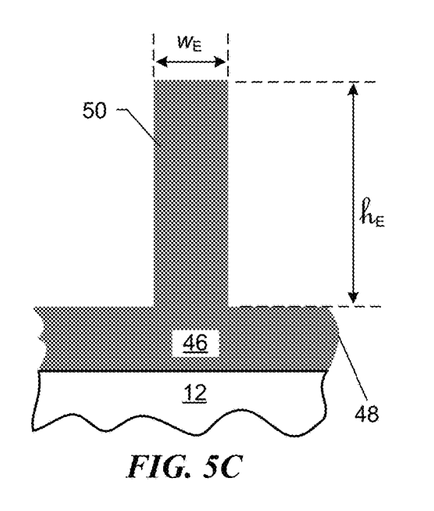
Figure 5D:
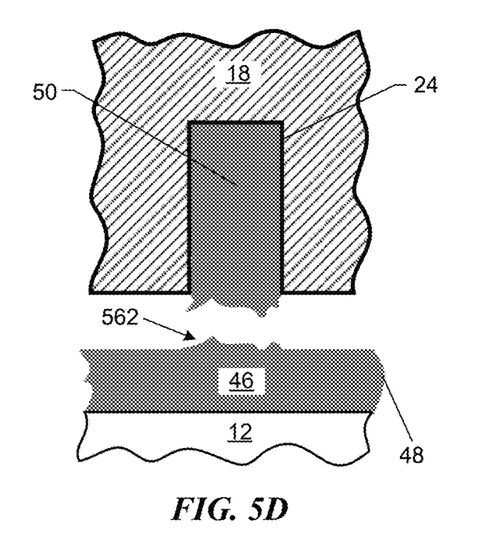

As previously observed, this rapid acceleration near the last point of separation (LPOS) can induce separation defects. The defect mechanism can be further understood with reference to FIGS. 5A-5D. FIG. 5A shows a portion of template 18 in contact with patterned layer 46 formed on substrate 12. Patterned layer 46 includes feature 50 (having height $h_O$ and width $w_O$) that has been formed within the corresponding recess 24 of template 18. As separation force F is applied, as is depicted in FIG. 5B, separation of template 18 starts at base 560 of feature 50. Under the rapid accelerated conditions previously described, this causes an elongation of feature 50, even as base 560 of feature 50 shrinks away from the sides of template recess 24 near base 560. The result of such elongation is depicted in FIG. 5C where feature 50 is both thinner and taller than the original feature dimension (i.e., $w_E<w_O$ and $h_E>h_O$). This effect alone can alter the feature critical dimensions (CDs) across the LPOS area, and such CD variation alone can produce device defects upon subsequent processing. Worse still, such elongation can cause denser features to collapse upon another altogether, rendering the final pattern unusable. In the extreme case, as depicted in FIG. 5D, the elongation proceeds until pattern feature 50 shears away from patterned layer 46 altogether, resulting in missing features in the pattern and a resultant plugging defect in the template 18 (i.e., recess 24 remains plugged with the sheared-off feature 50). The end result is that various unwanted defects are generated at the LPOS. In the case of template replication processes, this renders the resultant replica template unsuitable for device fabrication, particularly if multiple defects or a single very large defect are left in the replica template.

Figure 6:
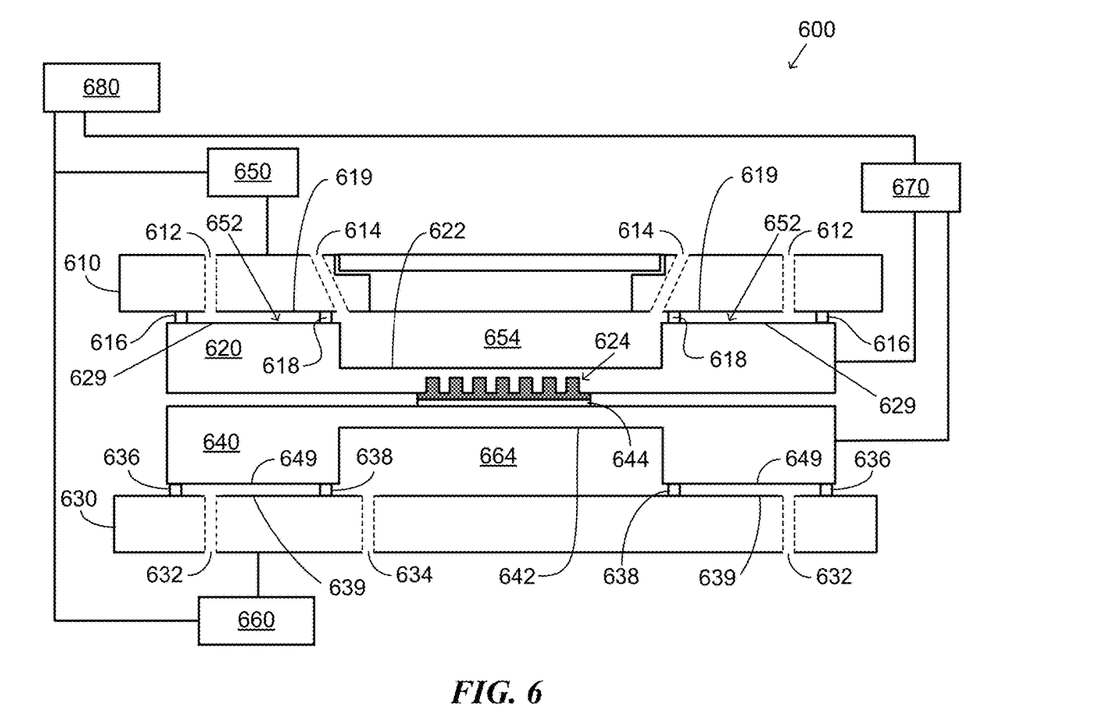
FIG. 6 illustrates a simplified view of a template-substrate separating apparatus according to an embodiment of the invention.

Turning now to FIG. 6, exemplary apparatus 600 is depicted therein that is able to eliminate or at least minimize the stored energy imparted to the template or substrate during separation and thereby reduce if not eliminate LPOS defects. System 600 is particularly designed for template replication and includes master chuck 610 configured to retain master template 620. Chuck 610 incorporates gas ports 612 and 614 in fluid communication with pressure system 650 and further includes sealing lands 616 and 618 extending from chuck surface 619. Master template 620 is actively held against sealing lands 616 and 618 of chuck 610 by applying, via pressure system 650, vacuum pressure to peripheral back side 629 of master template 620 through ports 612. More particularly, the positioning of master template 620 against lands 616 and 618 creates chamber 652, defined by chuck surface 619, lands 616 and 618, and template peripheral back side 629, that is fluid communication with port 612 and to which vacuum can thus be applied via pressure system 650 in order to chuck the template 620 against chuck 610. When template 620 is so retained, the interior back side 622 of master template 620 can likewise be placed under positive or vacuum pressure via pressure system 650, through ports 614. That is, with master template 620 so retained, chamber 654 is formed that is defined by chuck surface 619, sealing land 618, and inner back side 622 of template 620. Chamber 654 is in fluid communication with pressure system 650 through ports 614. Replica chuck 630 is similarly configured to retain replica substrate 640 and likewise incorporates gas ports 632 and 634 in fluid communication with separate pressure system 660. Replica chuck 630 likewise further includes sealing lands 636 and 638 extending from its surface 639, and with replica substrate 640 positioned against lands 636 and 638, chamber 662 is formed, defined by chuck surface 639, lands 636 and 638, and substrate peripheral back side 649. Chamber 662 is in fluid communication with port 632 through which vacuum can thus be applied via pressure system 660 in order to chuck replica substrate 640 against chuck 630. With replica substrate 640 so retained, the interior back side 662 of master template 640 can be placed under positive or vacuum pressure, again via pressure system 660, through port 634. That is, with replica substrate 640 so retained, chamber 664 is formed that is defined by chuck surface 639, sealing land 638, and inner back side 642 of substrate 640, with chamber 664 in fluid communication with pressure system 660. Pressure systems 650 and 660 further include pressure sensors (not shown) that are located at or near chambers 654 and 664, respectively, to monitor the amount of pressure that is applied to back sides 622 and 624 of template 620 and substrate 640, respectively.

In some examples, both master template 620 and replica substrate 640 begin as conventional 6 inch by 6 inch by 0.25 inch blank fused silica plates. Patterned area 624 of template 620 can be 26 mm×33 mm, which is a semiconductor industry standard. Mesa 644 of replica substrate 640, on which the replica pattern will be generated, can similarly be 26 mm×33 m. In additional examples, template 620 and substrate 640 can have a center 64 mm backside area cored out such that the interior thickness of template and substrate or both set to a thickness of 1.1 mm.

Apparatus 600 further includes force detection system 670 for detecting and measuring the separation force applied during the separation process. In some examples, chuck 610 can be connected to an imprint head such as imprint head 30 of system 100, such that movement of the imprint head causes movement of chuck 610 and retained template 620 relative to chuck 630 and retained substrate 640. Such relative movement in turn imparts a tensional force to the template and substrate for separation. In such examples, imprint head movement can be controlled by voice coil actuators such that the applied tensional force can be measured at any point during separation by monitoring the voice coil current (i.e., the applied force is proportional to the voice coil current). Other known force detectors and force detector systems that allow for real-time monitoring can likewise be implemented. Controller 680 is in communication with pressure systems 650 and 660 and force detection system 670. In general, controller 680 receives inputs from force detection system 670, and, as further detailed below, provides appropriate signals to pressure system 650 and/or 660 to apply appropriate amounts of positive or vacuum pressure to the interior backsides of template 620 or substrate 640

Figure 7A:
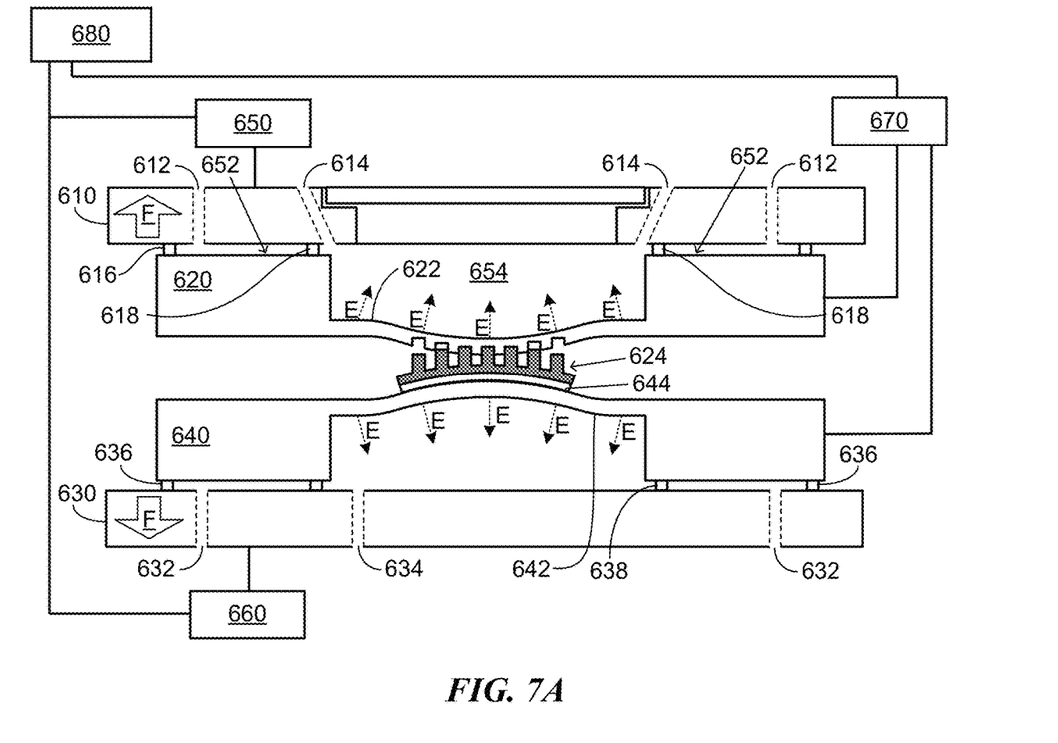
FIGS. 7A-7B illustrate a simplified view of the operation of the apparatus of FIG. 6.
Figure 7B:
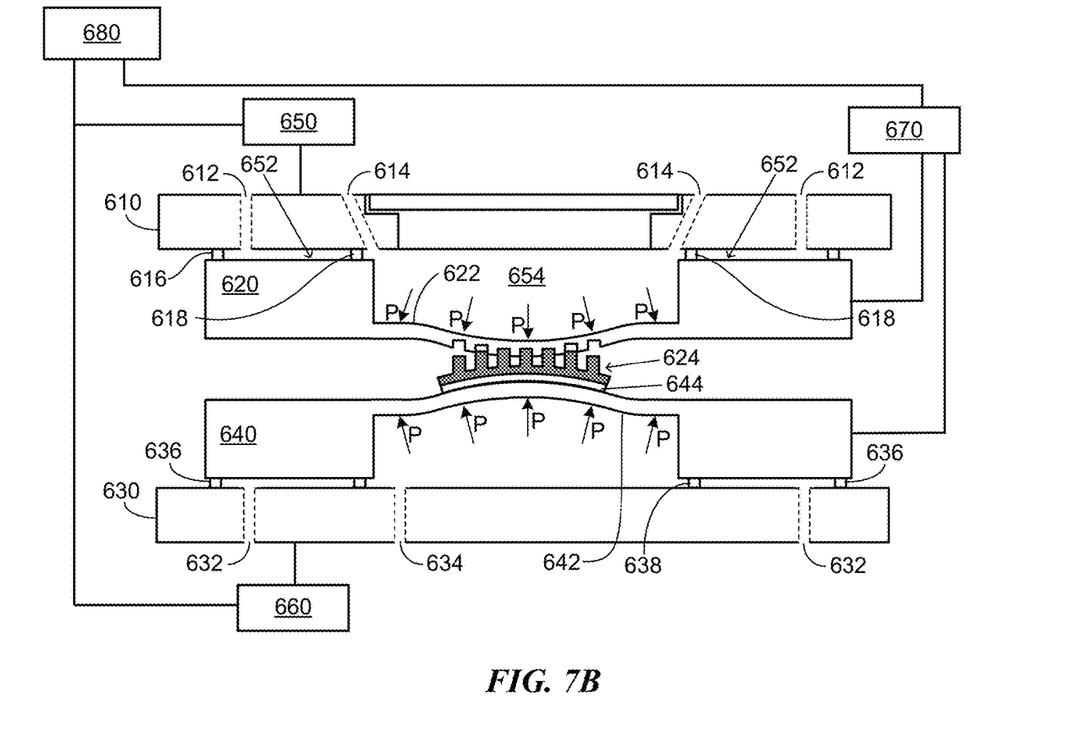
Figure 8A:
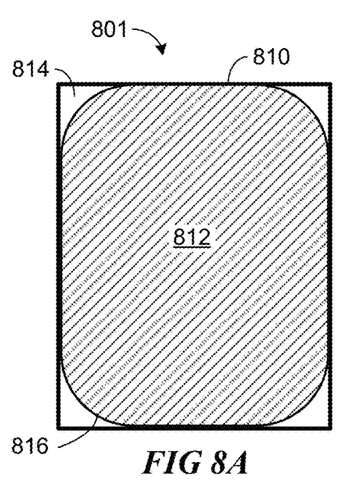
FIGS. 8A-8F illustrate a simplified view of the separation front as the template separates from the substrate according to an embodiment of the invention.
Figure 8B:
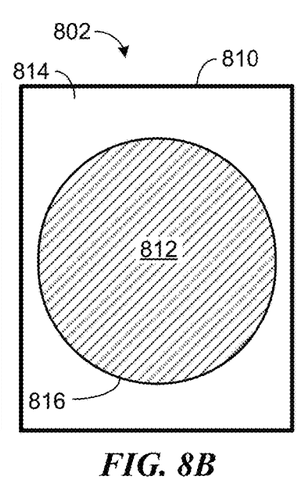
Figure 8C:
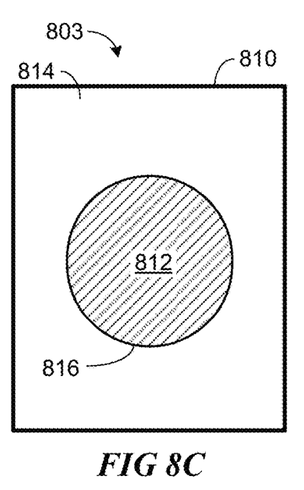
Figure 8D:
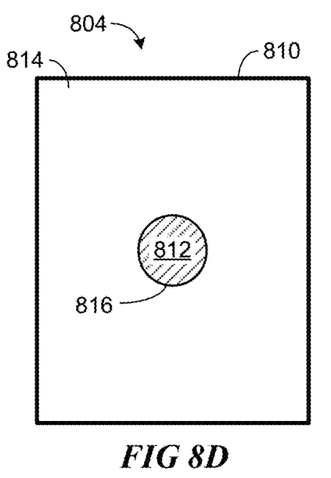
Figure 8E:
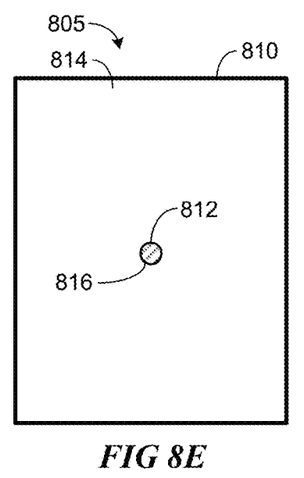
Figure 8F:
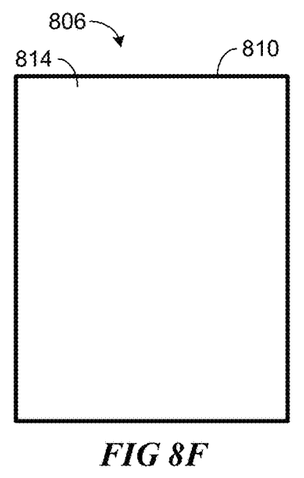

FIG. 7A-7B illustrate the use of apparatus 600 in the separation process. Tensional force F is applied to chuck 610 or 630 (or both) to initiate separation of template 620 from replica substrate 640 (FIG. 7A). For example, where apparatus 600 is incorporated into a system such as system 100, tensional force F can be induced through the upward motion of imprint head 30. As previously described, the application of such tensional force leads to a build-up of stored energy E in template 620 and substrate 640 which, when converted to kinetic energy as separation proceeds, can result in LPOS defects. To relieve the stored energy induced by this action, the tensional force is detected and measured by force detection system 670, at intervals, and the amount of such applied force is transmitted by force detection system 670 to controller 680 at such intervals. Based on this input, controller 680 determines the appropriate amount of back pressure to apply to back sides 622 and 642 of template 620 and substrate 640, respectively, in order to counteract the built-up stored energy in template 620 and substrate 640, and then signals pressure systems 650 and 660 to apply such pressure. Upon the application of such determined back pressure, template 620 and substrate 640 are stabilized as the applied back pressure counteracts the stored up energy such that the template or substrate bending is now a static condition (FIG. 7B). At the same time, the counteracting of such built-up stored energy in template 620 and substrate 640 reduces the amount of tensional force needed to continue the separation process. That is, with template 620 and substrate 640 stabilized by the applied back pressure, further separation can proceed at a lesser applied tensional force. Thus, the separation process continues iteratively and at lower overall applied tensional force levels. That is, tensional force is again applied, the force is again measured and the appropriate back pressure is again applied to the template and substrate until they are again balanced to compensate for the plate bending energy in the templates. The process is repeated until complete separation between the template and substrate is achieved. The result is that the speed of separation during any point in the entire separation process is well controlled and performed under a low tensional force, e.g., less than 10 N or less than 6 N or less 3 N, throughout the entire process. In some examples, the low tensional force is at least less than 6 N. In this manner, the final speed of separation can be maintained, slowed, stopped or sped up as necessary and the LPOS defects are at least minimized if not wholly eliminated. Once final separation has been achieved, the back pressure applied against back sides 622 and 642 of template 620 and substrate 640 is removed, and substrate 640 can undergo additional processing to transfer pattern features into mesa 644 such that it can be used as a replica template.

This separation control is further illustrated with reference to FIGS. 8A-8F. FIGS. 8A-8F are simplified illustrations of images taken during separation of template 620 from substrate 640 using the above a scheme. Similar to FIGS. 3A-3E, contact area 812 represents the area in which template and substrate are still in contact with separated area 814 designating that area of the template where separation has already occurred. Contact line 816 indicates the line of demarcation between contact area 812 and separated area 814. FIGS. 8A-8F show consecutive separation images 801, 802, 803, and 804 taken at approximately 13 second intervals. Even as contact area 812 is reduced, there is no sudden acceleration of separation causing an LPOS defect. Rather, separation continues smoothly with a controlled radius of separation. Even for the final contact image shown (FIG. 8E) which was captured within a second of final separation (FIG. 8F), the template and substrate remain in good contact, even for a contact area on the order of only 3 mm².

Figure 9A:
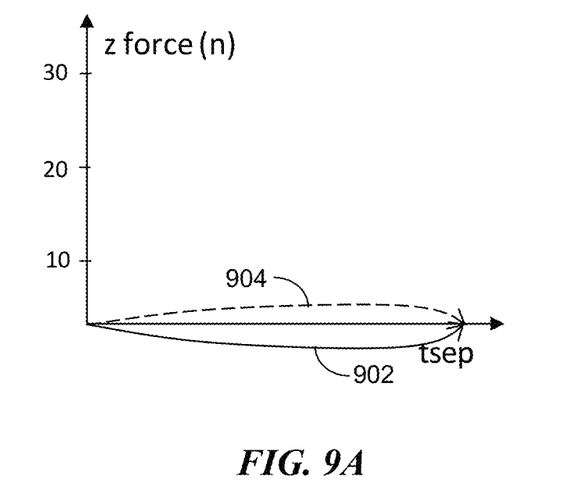
FIG. 9A illustrates a plot of the tensional force applied to the template and substrate as a function of time during the separation depicted in FIGS. 8A-8F.
Figure 9B:
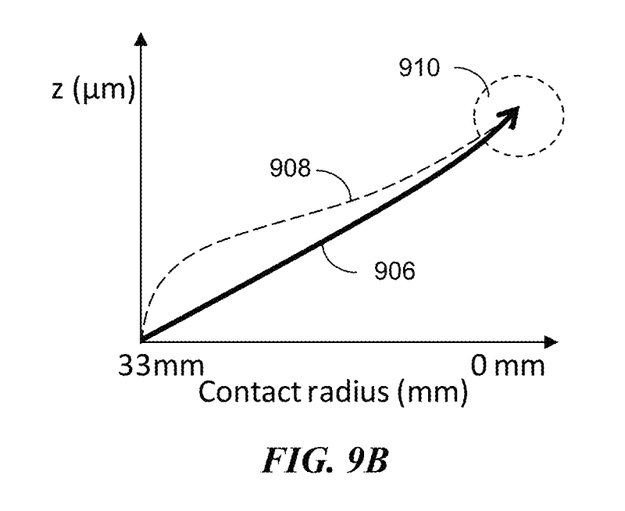
FIG. 9B illustrates a plot of separation acceleration during the separation depicted in FIGS. 8A-8F.

Two examples of how this separation control works is further illustrated in FIGS. 9A and 9B. FIG. 9A plots the applied tensional force as a function of time for the entire separation process. As with FIGS. 5A-5B, separation is performed using a system such as system 100 where the applied tensional force for separation is imparted by the upward movement of imprint head 30. Again, a typical time scale for separation can range from a second to 10 minutes, with 30 seconds-120 seconds being a more typical process. FIG. 9B plots the upward increase in movement of the imprint head as a function of contact radius. The solid curve 902 in FIG. 9A shows a condition where some residual force exists as the two templates first begin to separate. Back pressures are iteratively adjusted during the separation process, as previously described, such that slope of the upward movement of the imprint head as a function of contact radius becomes constant towards the end of the separation process, as shown by solid curve 906 in FIG. 9B. In the second example, as depicted by dashed curve 904 in FIG. 9A, pressure is applied to overcompensate the tensional force, and as the separation process continues, the back pressures are again iteratively adjusted so that the slope of the upward movement of the imprint head as a function of contact radius remains essentially constant through the entire separation process, as noted by the dashed curve 908 in FIG. 9B, until separation is final (i.e., at position 910).

As mentioned above, in some examples, the master template and replica substrate material, thicknesses and cored out diameters can be the same. This is not a necessary condition, however, since the bending or deflection is a function of the applied back pressure, and the radius and thickness of the cored out deflected area. For example, if one of the template or replica cored out areas was reduced from a diameter of 65 mm to a diameter of 60 mm, the template or replica thickness would need to be reduced to 0.97 mm for the same bending or deflection, assuming the applied back pressures remained the same as to both. The two back pressures applied to the master template and replica substrate also do not have to be the same. As an example, if the cored out areas are both set to a diameter of 64 mm, and the thicknesses are set to 1.1 mm for the master template and 1.0 mm for the replica substrate, then a pressure applied to the master template that is about 21 percent greater than the pressure applied to the replica substrate will achieve the same bending or deflection. Furthermore, while such differences in pressure are acceptable for minimizing stored energy in the system, it is important to note that at no time can back pressures be increased to the point where they begin to impact the vacuum forces being used to chuck the template or replica in place. In general, the vacuum pressure is on the order of 80 kPa. Applying a safety factor of 2 would therefore limit the applied pressure to any of the templates to about 40 kPa.

In addition, although above examples describe a cored area thickness of 1.1 mm, the actual thickness can be as little as 0.100 mm and as large as 2.0 mm. Additionally, dissimilar materials can also be used for the master template and replica substrate. As an example, the master template can be fabricated from fused silica and the replica substrate can be fabricated from silicon. Again setting the pressures to be the same and the cored-out areas to have the same diameter of 32 mm, if the fused silica template has a thickness of 1.1 mm, then the required calculated thickness for the silicon template is approximately 0.73 mm. Other possible template materials include organic polymers, siloxane polymers, borosilicate glass, fluorocarbon polymers, metal, hardened sapphire, and/or the like It should also be noted that although the discussion has primarily focused on the controlled separation of a master template from a replica substrate, the method described can also be applied to the separation of any template and substrate in a nanoimprint process for device manufacture or other processes. Suitable substrate materials can include fused silica, silicon, GaAs, GaN, InP, Sapphire, as well as other substrates known in the art. The template that provides the pattern to be created on the device substrate can be materials other than fused silica. Thermal nanoimprint lithography, as an example, uses a thermal process to cure the nanoimprint resist. A typical template material used in thermal nanoimprint lithography is silicon. Additional possible template materials include polymers and plastics. For the cases of polymers and plastics, because the Young's modulus are much lower than that of either silicon or fused silica. The thicknesses can be much greater than 1.1 mm, and approach 5 to 6 mm as a minimum. Substrates and templates are also not confined to the 6 in×6 in plate configuration. Silicon substrates, as an example, are often round, and have diameters ranging from 50 mm up to 450 mm and generally referred to as wafers. Other substrates that can take on a wafer form include fused silica, silicon, GaAs, GaN, InP, Sapphire, as well as other substrates known in the art. These same substrates can also be plate shaped, with varying x and y dimensions as well as varying thicknesses.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An apparatus comprising:
    a template chuck or holder configured to hold a cored-out master template;
    a substrate chuck or holder configured to hold a cored-out replica template;
    an actuator system configured to adjust the position of the cored-out master template and the cored-out replica template relative to one another;
    a pressure system configured to apply a back pressure to the cored-out master template and the cored-out replica template; and
    a controller in communication with the pressure system, the controller configured to:
        determine the amount of pressure to apply to the backsides of the cored-out master template and the cored-out replica template, such that a slope of a movement of the cored-out master template relative to the cored-out replica template as a function of contact radius of a demarcation between a contact area and a separated area is controlled, and
        provide a signal to the pressure system such that the pressure system applies the determined amount of back pressure to the cored-out master template and the cored-out replica template.

2. The apparatus of claim 1, further configured to separate the cored-out master template from a solidified patterned layer formed on the cored-out replica template, wherein the controller is further configured to repeat the determining and providing steps until the cored-out master template is fully separated from the solidified patterned layer.

3. The apparatus of claim 1 wherein the controller is further configured to determine the amount of pressure to apply to the backsides of the cored-out master template and the cored-out replica template in order to counteract stored energy in the cored-out master template and cored-out replica template that is created by a bending of the cored-out master template and the cored-out replica template induced by an applied tensional force.

4. The apparatus of claim 1 wherein the controller is further configured to determine the amount of pressure to apply to the backsides of the cored-out master template and the cored-out replica template to reduce an applied tensional force to zero or below.

5. The apparatus of claim 1 wherein the cored-out master template and the cored-out replica template have the same thickness dimensions.

6. The apparatus of claim 1, further comprising:
    a force detection system configured to detect an amount of tensional force applied to the cored-out master template and cored-out replica template during separation of the cored-out master template from a solidified patterned layer formed on the cored-out replica template.

7. The apparatus of claim 1, further comprising:
    a fluid dispense system configured to deposit a formable material on the cored-out replica template.

8. The apparatus of claim 7, further comprising:
    a source configured to produce energy, causing the formable material on the cored-out replica template to solidify.

9. The apparatus of claim 1 wherein the cored-out master template and the cored-out replica template are formed of the same material.

10. The apparatus of claim 1 wherein the controller is further configured to repeat the determining and providing steps more than twice.

11. The apparatus of claim 1, wherein the applied back pressure is iteratively adjusted, such that the slope of relative movement of the cored-out master template and the cored-out replica template as the function of the contact radius becomes constant towards the end of the cored-out master template fully separating from a solidified patterned layer on the cored-out replica template.

12. The apparatus of claim 1, wherein the applied back pressure is iteratively adjusted, such that the slope of relative movement of the cored-out master template and the cored-out replica template as the function of the contact radius becomes essentially constant while the cored-out master template is separating from a solidified patterned layer on the cored-out replica template.

13. The apparatus of claim 1, wherein the actuator system is further configured to induce a bending of both the cored-out master template and the cored-out replica template while adjusting the position of the cored-out master template and the cored-out replica template relative to one another during separation of the cored-out master template from a solidified patterned layer on the cored-out replica template.

* * * * *